United States Patent
Curtis

(10) Patent No.: US 12,205,419 B2
(45) Date of Patent: Jan. 21, 2025

(54) MOBILE COMPUTE SYSTEM WITH INTERFACE VERIFICATION MECHANISM AND METHOD OF OPERATION THEREOF

(71) Applicant: MOJ.IO, Inc., Vancouver (CA)

(72) Inventor: James Anthony Curtis, Temecula, CA (US)

(73) Assignee: MOJ.IO, Inc., Vancouver (CA)

( * ) Notice: Subject to any disclaimer, the term of this patent is extended or adjusted under 35 U.S.C. 154(b) by 336 days.

(21) Appl. No.: 17/685,178

(22) Filed: Mar. 2, 2022

(65) Prior Publication Data
US 2023/0282038 A1    Sep. 7, 2023

(51) Int. Cl.
*G07C 5/08* (2006.01)
*G01R 31/55* (2020.01)
*G07C 5/00* (2006.01)

(52) U.S. Cl.
CPC ............ *G07C 5/0808* (2013.01); *G01R 31/55* (2020.01); *G07C 5/008* (2013.01)

(58) Field of Classification Search
CPC ....... G01R 31/55; G01R 31/68; G07C 5/0808
See application file for complete search history.

(56) References Cited

U.S. PATENT DOCUMENTS

| | | | |
|---|---|---|---|
| 6,529,808 B1 * | 3/2003 | Diem | G01R 31/006 |
| | | | 701/33.6 |
| 10,417,839 B2 | 9/2019 | Allen, Jr. et al. | |
| 2009/0150118 A1 | 6/2009 | Naima | |
| 2017/0093866 A1 * | 3/2017 | Ben-Noon | H04W 12/068 |
| 2017/0345227 A1 | 11/2017 | Allen, Jr. et al. | |
| 2018/0182182 A1 * | 6/2018 | Meyer | G07C 5/085 |
| 2018/0227306 A1 * | 8/2018 | Borkowicz | H04L 63/0227 |
| 2019/0007511 A1 * | 1/2019 | Rodriguez | H04L 67/55 |
| 2019/0013621 A1 * | 1/2019 | Buhlman | G01R 31/58 |
| 2019/0228654 A1 * | 7/2019 | Olsen | G08G 1/096716 |
| 2019/0301845 A1 | 10/2019 | Nickel | |
| 2021/0375076 A1 | 12/2021 | Scotland et al. | |

FOREIGN PATENT DOCUMENTS

| | | | | |
|---|---|---|---|---|
| CN | 111426984 A * | 7/2020 | | G05B 23/0218 |
| TW | 201313527 A * | 4/2013 | | |
| WO | WO-2019043471 A1 * | 3/2019 | | G07C 5/006 |
| WO | WO-2020089643 A1 * | 5/2020 | | G07C 5/008 |

* cited by examiner

*Primary Examiner* — Khoi H Tran
*Assistant Examiner* — Dairon Estevez
(74) *Attorney, Agent, or Firm* — Perspectives Law Group, Corp.

(57) ABSTRACT

A method of operation of a mobile compute system comprising: identifying a vehicle prepared to travel by monitoring an on-board diagnostics; detecting an unplug event based on a message from the on-board diagnostics; detecting a trip in progress during the unplug event; and transferring the message identifying a loose connector pin in an on-board diagnostic port during the trip in progress for displaying on a device.

20 Claims, 8 Drawing Sheets

MOBILE COMPUTE SYSTEM WITH INTERFACE VERIFICATION MECHANISM AND METHOD OF OPERATION THEREOF

TECHNICAL FIELD

An embodiment of the present invention relates generally to a compute system, and more particularly to a mobile compute system with an interface verification mechanism.

BACKGROUND ART

Modern compute systems, especially transportation systems, are providing increasing levels of functionality to support modern life including additional status monitoring, connectivity services, and diagnostic services. Technology has enabled increased diagnostic information and usage of the diagnostic information for a vehicle. Research and development in the existing technologies can take a myriad of different directions.

As users become more dependent on the advantages provided by monitoring systems, in some cases the interface between the on-board diagnostic system and the monitoring system can be suspect and provide unreliable information to the user. Historically, intermittent connectivity problems have been the most difficult and expensive to resolve.

Thus, a need still remains for a mobile compute system with an interface verification mechanism. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a method of operation of a mobile compute system including: identifying a vehicle prepared to travel by monitoring an on-board diagnostics; detecting an unplug event based on a message from the on-board diagnostics; detecting a trip in progress during the unplug event; and transferring the message identifying a loose connector pin in an on-board diagnostic port during the trip in progress for displaying on a device.

An embodiment of the present invention provides a mobile compute system, including: a communication unit configured to: transmit a message, identifying a vehicle prepared to travel, through an on-board diagnostic, and receive the message from the on-board diagnostic identifying a loose connector pin in an on-board diagnostic port; a control circuit, coupled to the communication unit, configured to: determine an unplug event has occurred, detect a trip in progress during the unplug event, and transfer the message, to identify the loose connector pin in the on-board diagnostic port, for displaying on a device.

An embodiment of the present invention provides a non-transitory computer readable medium including instructions executable by a control circuit for a mobile compute system, including: identifying a vehicle prepared to travel by monitoring an on-board diagnostics; detecting an unplug event based on a message from the on-board diagnostics; detecting a trip in progress during the unplug event; and transferring the message identifying a loose connector pin in an on-board diagnostic port during the trip in progress for displaying on a device.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
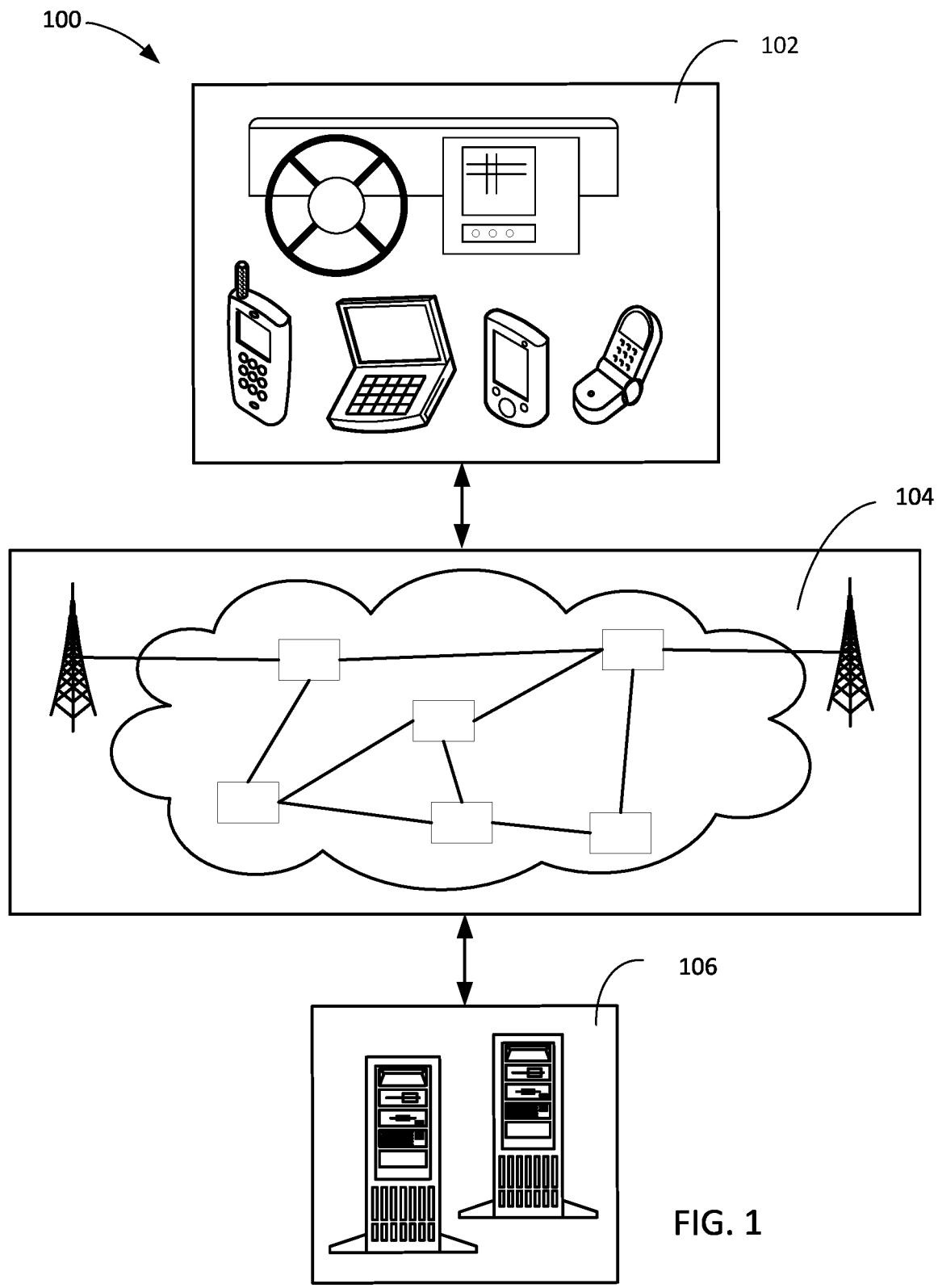
FIG. 1 is a mobile compute system with an interface verification mechanism in an embodiment of the present invention.

Embodiments provide the mobile compute system can minimize the complexity of detecting and identifying intermittent couplings between the on-board diagnostic system and a monitoring system by detecting the message group of the controller area network. The identification of the messages of the controller area network allows the compute system to match the message group with a footprint to monitor the integrity of the coupling between the on-board diagnostic system and the monitoring system of the vehicle of the compute system.

Embodiments provide the mobile compute system can identify the configuration and operational status of subsystems of the vehicle of the mobile compute system by processing the messages of the controller area network. The correct identification of the message group from the controller area network can allow the mobile compute system to identify the configuration and operational status of subsystems of the vehicle. As an example, the mobile compute system can determine the configuration and operational status of subsystems of the vehicle by comparing the message group to a database of identified vehicles.

Embodiments provide the simplified and robust determination of the configuration and operational status of subsystems based on the message group obtained by the on-board diagnostics from the controller area network without decoding the vehicle identification from the controller area network. For example, the mobile compute system can determine the configuration and operational status of subsystems of the vehicle when the vehicle identification cannot be decoded by the on-board diagnostics from the controller area network. As a further example, the mobile compute system can determine the configuration and operational status of subsystems of the vehicle before the on-board diagnostics decodes the vehicle identification from the controller area network.

Embodiments provide improvements to the reliability of the mobile compute system by processing the message group in the controller area network to verify the configuration and operational status of subsystems utilizing the vehicle identification. The controller area network vehicle identification mechanism can verify that the proper diagnostic information is being provided from the vehicle based on the vehicle make, the vehicle model and the model year. As an example, the mobile compute systems can correctly gather accurate records for the vehicle by accessing specific original equipment manufacturer (OEM) parameters for the vehicle.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention. The terms first, second, etc. can be used throughout as part of element names and are used as a matter of descriptive convenience and are not intended to have any other significance or provide limitations for an embodiment.

The term "module" referred to herein can include or be implemented as software, hardware, or a combination thereof in the present invention in accordance with the context in which the term is used. For example, the software can be machine code, firmware, embedded code, and application software. The software can also include a function, a call to a function, a code block, or a combination thereof. Also for example, the hardware can be gates, circuitry, processor, computer, integrated circuit, integrated circuit cores, a pressure sensor, an inertial sensor, a microelectromechanical system (MEMS), passive devices, physical non-transitory memory medium including instructions for performing the software function, a portion therein, or a combination thereof to control one or more of the hardware units or circuits. Further, if a module is written in the apparatus claims section below, the modules are deemed to include hardware circuitry for the purposes and the scope of apparatus claims.

The modules in the following description of the embodiments can be coupled to one other as described or as shown. The coupling can be direct or indirect without or with, respectively, intervening items between coupled items. The coupling can be physical contact or by communication between items.

Referring now to FIG. 1, therein is shown a mobile compute system 100 with an interface verification mechanism in an embodiment of the present invention. The mobile compute system 100 includes a first device 102, such as a client or a server, connected to a second device 106, such as a client or server. The first device 102 can communicate with the second device 106 through a communication path 104, such as a wireless or wired network.

For example, the first device 102 can be of any of a variety of devices, such as a vehicle, a telematics system in a vehicle, a computing device, a cellular phone, a tablet computer, a smart phone, a notebook computer, vehicle embedded navigation system, or computing device. The first device 102 can couple, either directly or indirectly, to the communication path 104 to communicate with the second device 106 or can be a stand-alone device.

The second device 106 can be any of a variety of centralized or decentralized computing devices, sensor devices to take measurements or record environmental information, such as sensor instruments, sensor equipment, or a sensor array. For example, the second device 106 can be a multimedia computer, a laptop computer, a desktop computer, grid-computing resources, a virtualized computer resource, cloud computing resource, routers, switches, peer-to-peer distributed computing devices, an on-board diagnostics dongle, or a combination thereof.

The second device 106 can be mounted externally or internally to a vehicle, centralized in a single room or within a vehicle, distributed across different rooms, distributed across different geographical locations, embedded within a telecommunications network. The second device 106 can couple with the communication path 104 to communicate with the first device 102.

For illustrative purposes, the mobile compute system 100 is described with the second device 106 as a computing device, although it is understood that the second device 106 can be different types of devices, such as a standalone sensor or measurement device. Also for illustrative purposes, the mobile compute system 100 is shown with the second device 106 and the first device 102 as end points of the communication path 104, although it is understood that the mobile compute system 100 can have a different partition between the first device 102, the second device 106, and the communication path 104. For example, the first device 102, the second device 106, or a combination thereof can also function as part of the communication path 104.

The communication path 104 can span and represent a variety of networks and network topologies. For example, the communication path 104 can include wireless communication, wired communication, optical, ultrasonic, or the combination thereof. Satellite communication, cellular communication, Bluetooth, Infrared Data Association standard (IrDA), wireless fidelity (WiFi), and worldwide interoperability for microwave access (WiMAX) are examples of wireless communication that can be included in the communication path 104. Ethernet, digital subscriber line (DSL), fiber to the home (FTTH), and plain old telephone service (POTS) are examples of wired communication that can be included in the communication path 104. Further, the communication path 104 can traverse a number of network topologies and distances. For example, the communication path 104 can include direct connection, personal area network (PAN), local area network (LAN), metropolitan area network (MAN), wide area network (WAN), or a combination thereof.

Figure 2:
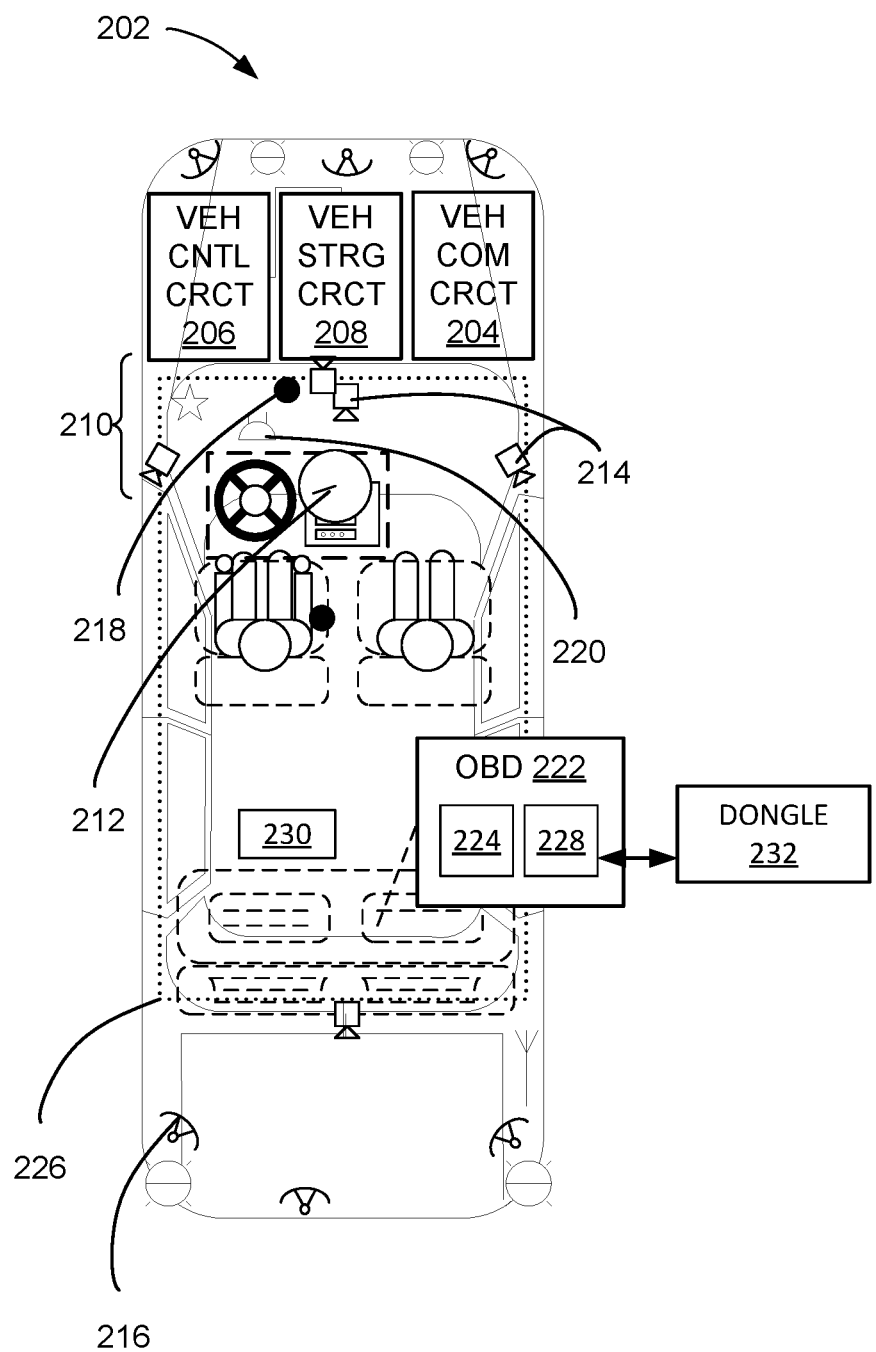
FIG. 2 is an example of a top plan view illustration of a vehicle for the mobile compute system.

Referring now to FIG. 2, therein is shown an example a top plan view of a vehicle 202 for the mobile compute system 100 of FIG. 1. As an example, the mobile compute system 100 can include or interact with the first device 102 of FIG. 1 as the vehicle 202. The vehicle 202 can also include one or more of environmental sensors 210. The vehicle 202 is an object or a machine used for transporting people or goods. The vehicle 202 can also be capable of providing assistance in maneuvering or operating the object or the machine.

The vehicle 202 can include or represent different types of vehicles. For example, the vehicle 202 can be an electric vehicle, a combustion vehicle, or a hybrid vehicle. Also for example, the vehicle 202 can be an autonomous vehicle or non-autonomous vehicle. As a specific example, the vehicle 202 can include a car, a truck, a bus, a cart, or a combination thereof.

The vehicle 202 can include a device, a circuit, one or more specific sensors, or a combination thereof for providing assistance or additional information to control, maneuver, or operate the vehicle 202. The vehicle 202 can include a vehicle communication circuit 204, a vehicle control circuit 206, a vehicle storage circuit 208, other interfaces, or a combination thereof.

The vehicle 202 can also include on-board diagnostics 222 (OBD) that can be accessed by the vehicle control circuit 206. As an example, the vehicle control circuit 206 can access the on-board diagnostics 222 with the vehicle communication circuit 204. The vehicle 202 can store and retrieve the on-board diagnostics 222 to and from the vehicle storage circuit 208.

The on-board diagnostics 222 present information about the vehicle 202. For example, the on-board diagnostics 222 can provide status or the state of the vehicle 202 or a portion thereof. The on-board diagnostics 222 can also present an ignition status 224. The ignition status 224 represents the current state of ignition. The ignition status 224 can represent whether the engine is on or off. The term "on" refers to the engine that is in a condition to propel the vehicle 202. The term "off" refers to the engine that is not in a condition to propel the vehicle 202.

The on-board diagnostics 222 can provide information about subsystems 230 that monitor operation of the vehicle 202. Although the subsystems 230 can differ in operation, performance, and type depending on the vehicle 202, the subsystems 230 provides operational values that can be read as part of the on-board diagnostics 222. The subsystems 230 can monitor different functions including engine control unit, braking system, infotainment system, transmission system, tire pressure system, environmental system, and a body control system.

The on-board diagnostics 222 can be transmitted by a controller area network 226 in the vehicle 202. The controller area network 226 allows communication between the vehicle communication circuit 204, the vehicle control circuit 206, the vehicle storage circuit 208, the on-board diagnostics 222, other interfaces, or a combination thereof. The controller area network 226 can also allow for communication with the environmental sensors 210 and with the rest of the vehicle 202.

The on-board diagnostics 222 can be read by an external device utilizing an on-board diagnostics port 228. The on-board diagnostics port 228 allows an external device to communicate with the vehicle communication circuit 204, the vehicle control circuit 206, the vehicle storage circuit 208, the on-board diagnostics 222, the subsystems 230, other interfaces, or a combination thereof along the controller area network 226. For example, the on-board diagnostics port 228 can be accessed utilizing an on-board diagnostics dongle 232, such as a plug-in device configured to interface with the on-board diagnostics port 228. The on-board diagnostics dongle 232 can be an electronic assembly that plugs directly into the on-board diagnostics port 228 having a one-to-one pin correspondence. The on-board diagnostic dongle 232 can be configured for monitoring the operation of the vehicle 202 by receiving information about the operation of the subsystems 230 through the on-board diagnostic 222. By way of an example, the on-board diagnostics dongle 232 can detect that the vehicle 202 is ready to travel by receiving information through the on-board diagnostic 222 including information from the engine, transmission, and the braking system including determining that an engine is on, a brake is engaged, and a transmission is engaged.

The vehicle storage circuit 208 can include a functional unit or circuit integral to the vehicle 202 and configured to store and recall information. The vehicle storage circuit 208 can be a volatile memory, a nonvolatile memory, an internal memory, an external memory, or a combination thereof. For example, the vehicle storage circuit 208 can be a nonvolatile storage such as non-volatile random access memory (NVRAM), Flash memory, disk storage, or a volatile storage such as static random access memory (SRAM).

The vehicle storage circuit 208 can store vehicle software, other relevant data, such as input information, information from sensors, processing results, information predetermined or preloaded by the mobile compute system 100, the vehicle manufacturer, or a combination thereof. The vehicle storage circuit 208 can store the information for the on-board diagnostics 222.

The vehicle control circuit 206 can include a functional unit or circuit integral to the vehicle 202 and configured to execute or implement instructions. The vehicle control circuit 206 can execute or implement the vehicle software to provide the intelligence of the vehicle 202, the mobile compute system 100, or a combination thereof. The vehicle control circuit 206 can respond to requests for the on-board diagnostics 222. The request can be from other parts of the vehicle 202, the mobile compute system 100, or a combination thereof or external to the mobile compute system 100.

The vehicle control circuit 206 can be implemented in a number of different manners. For example, the vehicle control circuit 206 can be a processor, an application specific integrated circuit (ASIC) an embedded processor, a microprocessor, a hardware control logic, a hardware finite state machine (FSM), a digital signal processor (DSP), or a combination thereof. As a more specific example, the vehicle control circuit 206 can include an engine control unit, one or more central processing unit, or a combination thereof.

The vehicle communication circuit 204 can include a functional unit or circuit integral to the vehicle 202 and configured to enable external communication to and from the vehicle 202. For example, the vehicle communication circuit 204 can permit the vehicle 202 to communicate with the first device 102, the second device 106 of FIG. 1, the communication path 104 of FIG. 1, or a combination thereof. The vehicle communication circuit 204 can provide the on-board diagnostics 222 to other portions of the vehicle 202, the mobile compute system 100, or a combination thereof or external to the mobile compute system 100.

The vehicle communication circuit 204 can also function as a communication hub allowing the vehicle 202 to function as part of the communication path 104 and not limited to be an end point or terminal circuit to the communication path 104. The vehicle communication circuit 204 can include active and passive components, such as microelectronics or an antenna, for interaction with the communication path 104. For example, the vehicle communication circuit 204 can include a modem, a transmitter, a receiver, a port, a connector, or a combination thereof for wired communication, wireless communication, or a combination thereof.

The vehicle communication circuit 204 can couple with the communication path 104 to send or receive information directly between the vehicle communication circuit 204 and the first device 102, the second device 106, or a combination thereof as endpoints of the communication, such as for direct line-of-sight communication or peer-to-peer communication. The vehicle communication circuit 204 can further couple with the communication path 104 to send or receive information through a server or another intermediate device in between endpoints of the communication.

The vehicle 202 can further include various interfaces. The vehicle 202 can include one or more interfaces for interaction or internal communication between the subsystems 230 or circuits of the vehicle 202. For example, the vehicle 202 can include one or more interfaces, such as drivers, firmware, wire connections or buses, protocols, or a combination thereof, for the vehicle storage circuit 208, the vehicle control circuit 206, or a combination thereof.

The vehicle 202 can further include one or more interfaces for interaction with an occupant, an operator or a driver, a passenger, or a combination thereof relative to the vehicle 202. For example, the vehicle 202 can include a user interface including input or output devices or circuits, such as a screen or touch screen, a speaker, a microphone, a keyboard or other input devices, an instrument panel, or a combination thereof.

The vehicle 202 can further include one or more interfaces along with switches or actuators for physically controlling movable components of the vehicle 202. For example, the vehicle 202 can include the one or more interfaces along with the controlling mechanisms to physically perform and control the maneuvering of the vehicle 202, such as for automatic driving or maneuvering features.

The functional units or circuits in the vehicle 202 can work individually and independently of the other functional units or circuits. The vehicle 202 can work individually and independently from the first device 102, the communication path 104, the second device 106, other devices or vehicles, or a combination thereof.

The functional units or circuits described above can be implemented in hardware. For example, one or more of the functional units or circuits can be implemented using the a gate, circuitry, a processor, a computer, integrated circuit, integrated circuit cores, a pressure sensor, an inertial sensor, a microelectromechanical system (MEMS), a passive device, a physical non-transitory memory medium containing instructions for performing the software function, a portion therein, or a combination thereof.

The environmental sensors 210 are each a device for detecting or identifying environment of the vehicle 202. The environmental sensors 210 can detect, identify, determine, or a combination thereof for the vehicle 202 itself, such as for status or movement thereof. The environmental sensors 210 can detect, identify, determine, or a combination thereof for environment within a cabin of the vehicle 202, an environment external to and surrounding the vehicle 202, or a combination thereof.

For example, the environmental sensors 210 can include a location-movement sensor 212, a visual sensor 214, a radar sensor 216, an accessory sensor 218, a volume sensor 220, or a combination thereof. The location-movement sensor 212 can identify or calculate a geographic location of the vehicle 202, determine a movement of the vehicle 202, or a combination thereof. Examples of the location-movement sensor 212 can include an accelerometer, a speedometer, a GPS receiver or device, a gyroscope or a compass, or a combination thereof. The vehicle 202 can include the environmental sensors 210 other than or in addition to the location-movement sensor 212, such as thermal sensor. The thermal sensor can capture and provide temperature readings for portions of the vehicle 202. The thermal sensor can also capture and provide temperature readings external to the vehicle 202.

The visual sensor 214 can include a sensor for detecting or determining visual information representing the environment external to and surrounding the vehicle 202. The visual sensor 214 can include a camera attached to or integral with the vehicle 202. For example, the visual sensor 214 can include a camera, such as forward facing camera, a rear-view or back-up camera, a side-view or a blind-spot camera, or a combination thereof. Also for example, the visual sensor 214 can include an infrared sensor or a night vision sensor.

The visual sensor 214 can further include a camera on the first device 102 connected to and interacting with the vehicle 202. The visual sensor 214 can further include a cabin camera for detecting or determining visual information inside the vehicle or cabin of the vehicle.

The radar sensor 216 can include an object-detection system, device, or circuit. The radar sensor 216 can determine or identify an existence of an object or a target, such as an obstacle or another vehicle, external to the vehicle 202 a relative location or a distance between the object or the target and the vehicle 202, or a combination thereof.

The radar sensor 216 can utilize radio waves to determine or identify an existence of the object or the target, the relative location or a distance from the vehicle 202, or a combination thereof. For example, the radar sensor 216 can include a proximity sensor or warning system, such as for an area in front of, behind, adjacent to or on a side of, or a combination thereof geographically or physically relative to the vehicle 202.

The accessory sensor 218 can include a sensor for determining or detecting a status of a subsystem or a feature of the vehicle 202. The accessory sensor 218 can determine or detect the status or a setting for windshield wipers, turn signals, gear setting, headlights, or a combination thereof.

The volume sensor 220 can include a sensor for detecting or determining sounds for the vehicle 202. The volume sensor 220 can include a microphone for detecting or determining sounds within a cabin of the vehicle 202. The volume sensor 220 can further include a circuit for detecting or determining a volume level or an output level of speakers within the vehicle 202.

The vehicle 202 can use one or more of the environmental sensors 210 to generate the on-board diagnostics 222 describing or representing information regarding the environment within or surrounding the vehicle 202. The on-board diagnostics 222 can be further processed with the vehicle control circuit 206, stored in the vehicle storage circuit 208, communicated to another device through the vehicle control circuit 206, or a combination thereof.

The vehicle 202 can further include a user device or a mobile device illustrated in FIG. 1. For example, the vehicle 202 can include the first device 102. As a further example, the vehicle 202 can include the on-board diagnostics dongle 232. The on-board diagnostics dongle 232 can analyze the messages transferred through the on-board diagnostic port 228. One of the common issues that can affect the on-board diagnostics dongle 232 is a loose connector pin between the on-board diagnostics dongle 232 and the on-board diagnostic port 228 in the vehicle 202. The loose connector pin can adversely affect the user experiences. The on-board diagnostics dongle 232 can be configured to detect and report the occurrence of loose or intermittent connections between the on-board diagnostic port 228 and the on-board diagnostics dongle 232.

As a more specific example, the vehicle communication circuit 204, the vehicle control circuit 206, the vehicle storage circuit 208, the environmental sensors 210, one or more interfaces, or a combination thereof can be included in or make up the first device 102 included in or integral with the vehicle 202. Also as a more specific example, the vehicle 202 can include or be integral with the first device 102 including an embedded computer system, an infotainment system, a smart driving or a driver assistance system, a self-driving or a maneuvering system for the vehicle, or a combination thereof.

Figure 3:
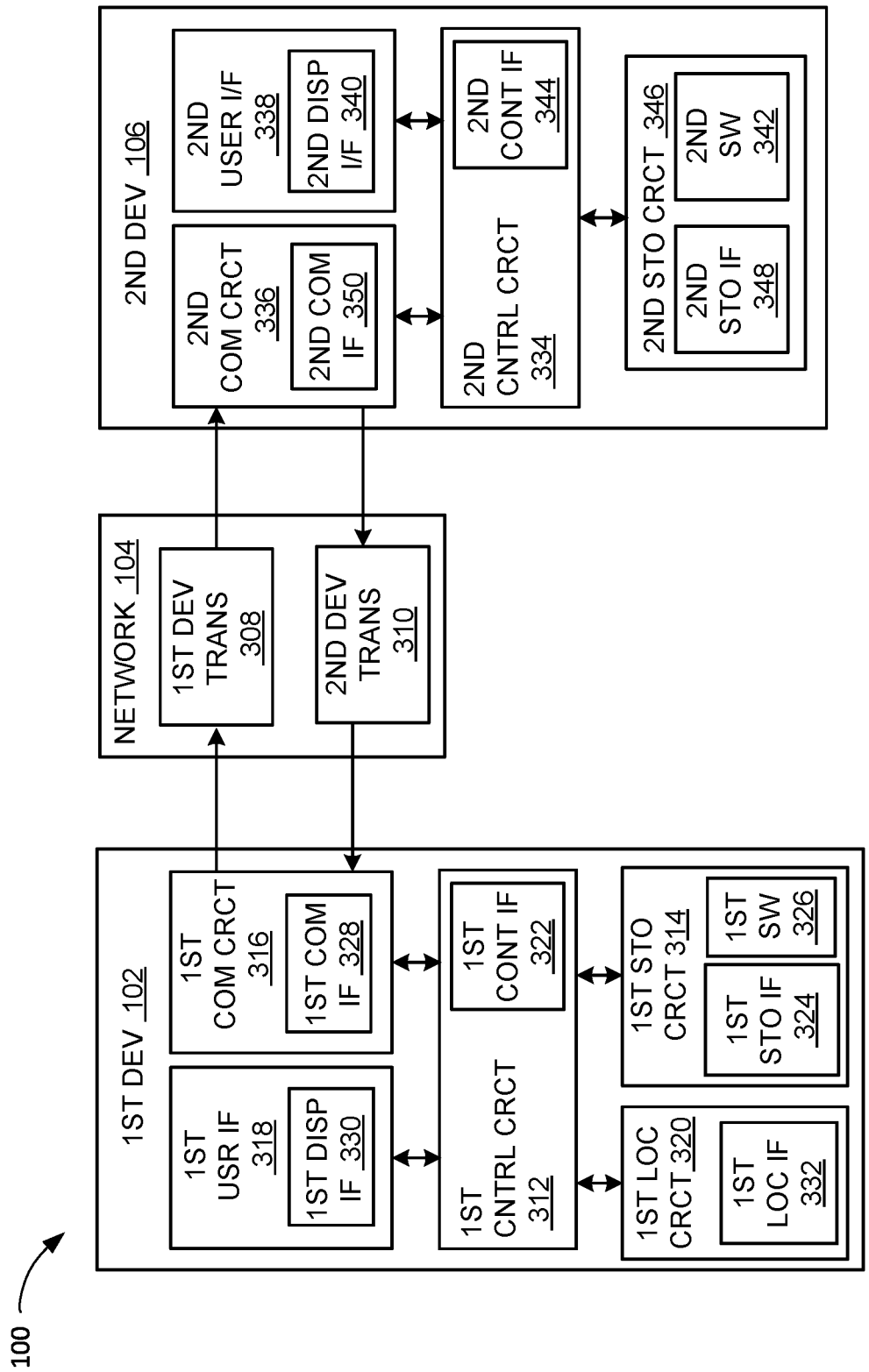
FIG. 3 is an exemplary block diagram of the mobile compute system.

Referring now to FIG. 3, therein is shown an exemplary block diagram of the mobile compute system 100. The mobile compute system 100 can include the first device 102, the communication path 104, and the second device 106. The first device 102 can send information in a first device transmission 308 over the communication path 104 to the second device 106. The second device 106 can send information in a second device transmission 310 over the communication path 104 to the first device 102.

For illustrative purposes, the mobile compute system 100 is shown with the first device 102 as a client device, although it is understood that the mobile compute system 100 can include the first device 102 as a different type of device. For example, the first device 102 can be a server including a display interface.

Also for illustrative purposes, the mobile compute system 100 is shown with the second device 106 as a server, although it is understood that the mobile compute system 100 can include the second device 106 as a different type of device. For example, the second device 106 can be a client device.

Further, for illustrative purposes, the mobile compute system 100 is shown with interaction between the first device 102 and the second device 106, although it is understood that the first device 102 can similarly interact another instance of the first device 102. Similarly, the second device 106 can similarly interact with another instance of the second device 106.

For brevity of description in this embodiment of the present invention, the first device 102 will be described as a client device and the second device 106 will be described as a server device. The embodiment of the present invention is not limited to this selection for the type of devices. The selection is an example of an embodiment of the present invention.

The first device 102 can include a first control circuit 312, a first storage circuit 314, a first communication circuit 316, and a first user interface 318, and a first location circuit 320. The first control circuit 312 can include a first control interface 322. The first control circuit 312 can execute a first software 326 to provide the intelligence of the mobile compute system 100.

The first control circuit 312 can be implemented in a number of different manners. For example, the first control circuit 312 can be a processor, an application specific integrated circuit (ASIC) an embedded processor, a microprocessor, a hardware control logic, a hardware finite state machine (FSM), a digital signal processor (DSP), or a combination thereof. The first control interface 322 can be used for communication between the first control circuit 312 and other functional units or circuits in the first device 102. The first control interface 322 can also be used for communication that is external to the first device 102.

The first control interface 322 can receive information from the other functional units/circuits or from external sources, or can transmit information to the other functional units/circuits or to external destinations. The external sources and the external destinations refer to sources and destinations external to the first device 102.

The first control interface 322 can be implemented in different ways and can include different implementations depending on which functional units/circuits or external units/circuits are being interfaced with the first control interface 322. For example, the first control interface 322 can be implemented with a pressure sensor, an inertial sensor, a microelectromechanical system (MEMS), optical circuitry, waveguides, wireless circuitry, wireline circuitry, or a combination thereof.

The first storage circuit 314 can store the first software 326. The first storage circuit 314 can also store the relevant information, such as data representing incoming images, data representing previously presented image, sound files, or a combination thereof.

The first storage circuit 314 can be a volatile memory, a nonvolatile memory, an internal memory, an external memory, or a combination thereof. For example, the first storage circuit 314 can be a nonvolatile storage such as non-volatile random access memory (NVRAM), Flash memory, disk storage, or a volatile storage such as static random access memory (SRAM).

The first storage circuit 314 can include a first storage interface 324. The first storage interface 324 can be used for communication between the first storage circuit 314 and other functional units or circuits in the first device 102. The first storage interface 324 can also be used for communication that is external to the first device 102.

The first storage interface 324 can receive information from the other functional units/circuits or from external sources, or can transmit information to the other functional units/circuits or to external destinations. The external sources and the external destinations refer to sources and destinations external to the first device 102.

The first storage interface 324 can include different implementations depending on which functional units/circuits or external units/circuits are being interfaced with the first storage circuit 314. The first storage interface 324 can be implemented with technologies and techniques similar to the implementation of the first control interface 322.

The first communication circuit 316 can enable external communication to and from the first device 102. For example, the first communication circuit 316 can permit the first device 102 to communicate with the second device 106 of FIG. 1, an attachment, such as a peripheral device or a desktop computer, and the communication path 104.

The first communication circuit 316 can also function as a communication hub allowing the first device 102 to function as part of the communication path 104 and not limited to be an end point or terminal circuit to the communication path 104. The first communication circuit 316 can include active and passive components, such as microelectronics or an antenna, for interaction with the communication path 104.

The first communication circuit 316 can include a first communication interface 328. The first communication interface 328 can be used for communication between the first communication circuit 316 and other functional units or circuits in the first device 102. The first communication interface 328 can receive information from the other functional units/circuits or can transmit information to the other functional units or circuits.

The first communication interface 328 can include different implementations depending on which functional units or circuits are being interfaced with the first communication circuit 316. The first communication interface 328 can be implemented with technologies and techniques similar to the implementation of the first control interface 322.

The first user interface 318 allows a user (not shown) to interface and interact with the first device 102. The first user interface 318 can include an input device and an output device. Examples of the input device of the first user interface 318 can include a keypad, a touchpad, soft-keys, a keyboard, a microphone, an infrared sensor for receiving remote signals, or any combination thereof to provide data and communication inputs.

The first user interface 318 can include a first display interface 330. The first display interface 330 can include an output device. The first display interface 330 can include a display, a projector, a video screen, a speaker, or any combination thereof.

The first control circuit 312 can operate the first user interface 318 to display information generated by the mobile compute system 100. The first control circuit 312 can also execute the first software 326 for the other functions of the mobile compute system 100, including receiving location information from the first location circuit 320. The first control circuit 312 can further execute the first software 326 for interaction with the communication path 104 via the first communication circuit 316.

The first location circuit 320 can generate location information, current heading, current acceleration, and current speed of the first device 102, as examples. The first location circuit 320 can be implemented in many ways. For example, the first location circuit 320 can function as at least a part of the global positioning system, an inertial vehicle system, a cellular-tower location system, a pressure location system, or any combination thereof. Also, for example, the first location circuit 320 can utilize components such as an accelerometer or global positioning system (GPS) receiver.

The first location circuit 320 can include a first location interface 332. The first location interface 332 can be used for communication between the first location circuit 320 and other functional units or circuits in the first device 102. The first location interface 332 can also be used for communication external to the first device 102. The location interface 332 can communicate with location satellites (not shown) in order to calculate pseudo ranges to the location satellites and identify the absolute location of the first device 102.

The first location interface 332 can receive information from the other functional units/circuits or from external sources, or can transmit information to the other functional units/circuits or to external destinations. The external sources and the external destinations refer to sources and destinations external to the first device 102.

The first location interface 332 can include different implementations depending on which functional units/circuits or external units/circuits are being interfaced with the first location circuit 320. The first location interface 332 can be implemented with technologies and techniques similar to the implementation of the first control circuit 312.

The second device 106 can be optimized for implementing an embodiment of the present invention in a multiple device embodiment with the first device 102. The second device 106 can provide the additional or higher performance processing power compared to the first device 102. The second device 106 can include a second control circuit 334, a second communication circuit 336, a second user interface 338, and a second storage circuit 346.

The second user interface 338 allows a user (not shown) to interface and interact with the second device 106. The second user interface 338 can include an input device and an output device. Examples of the input device of the second user interface 338 can include a keypad, a touchpad, soft-keys, a keyboard, a microphone, or any combination thereof to provide data and communication inputs. Examples of the output device of the second user interface 338 can include a second display interface 340 of FIG. 3. The second display interface 340 can include a display, a projector, a video screen, a speaker, or any combination thereof.

The second control circuit 334 can execute a second software 342 of FIG. 3 to provide the intelligence of the second device 106 of the mobile compute system 100. The second software 342 can operate in conjunction with the first software 326. The second control circuit 334 can provide additional performance compared to the first control circuit 312.

The second control circuit 334 can operate the second user interface 338 to display information. The second control circuit 334 can also execute the second software 342 for the other functions of the mobile compute system 100, including operating the second communication circuit 336 to communicate with the first device 102 over the communication path 104.

The second control circuit 334 can be implemented in a number of different manners. For example, the second control circuit 334 can be a processor, an embedded processor, a microprocessor, hardware control logic, a hardware finite state machine (FSM), a digital signal processor (DSP), or a combination thereof.

The second control circuit 334 can include a second control interface 344 of FIG. 3. The second control interface 344 can be used for communication between the second control circuit 334 and other functional units or circuits in the second device 106. The second control interface 344 can also be used for communication that is external to the second device 106.

The second control interface 344 can receive information from the other functional units/circuits or from external sources, or can transmit information to the other functional units/circuits or to external destinations. The external sources and the external destinations refer to sources and destinations external to the second device 106.

The second control interface 344 can be implemented in different ways and can include different implementations depending on which functional units/circuits or external units/circuits are being interfaced with the second control interface 344. For example, the second control interface 344 can be implemented with a pressure sensor, an inertial sensor, a microelectromechanical system (MEMS), optical circuitry, waveguides, wireless circuitry, wireline circuitry, or a combination thereof.

A second storage circuit 346 can store the second software 342. The second storage circuit 346 can also store the information such as data representing incoming images, data representing previously presented image, sound files, or a combination thereof. The second storage circuit 346 can be sized to provide the additional storage capacity to supplement the first storage circuit 314.

For illustrative purposes, the second storage circuit 346 is shown as a single element, although it is understood that the second storage circuit 346 can be a distribution of storage elements. Also for illustrative purposes, the mobile compute system 100 is shown with the second storage circuit 346 as a single hierarchy storage system, although it is understood that the mobile compute system 100 can include the second storage circuit 346 in a different configuration. For example, the second storage circuit 346 can be formed with different storage technologies forming a memory hierarchal system including different levels of caching, main memory, rotating media, or off-line storage.

The second storage circuit 346 can be a volatile memory, a nonvolatile memory, an internal memory, an external memory, or a combination thereof. For example, the second storage circuit 346 can be a nonvolatile storage such as non-volatile random access memory (NVRAM), Flash memory, disk storage, or a volatile storage such as static random access memory (SRAM).

The second storage circuit 346 can include a second storage interface 348. The second storage interface 348 can be used for communication between the second storage circuit 346 and other functional units or circuits in the second device 106. The second storage interface 348 can also be used for communication that is external to the second device 106.

The second storage interface 348 can receive information from the other functional units/circuits or from external sources, or can transmit information to the other functional units/circuits or to external destinations. The external sources and the external destinations refer to sources and destinations external to the second device 106.

The second storage interface 348 can include different implementations depending on which functional units/circuits or external units/circuits are being interfaced with the second storage circuit 346. The second storage interface 348 can be implemented with technologies and techniques similar to the implementation of the second control interface 344.

The second communication circuit 336 can enable external communication to and from the second device 106. For example, the second communication circuit 336 can permit the second device 106 to communicate with the first device 102 over the communication path 104.

The second communication circuit 336 can also function as a communication hub allowing the second device 106 to function as part of the communication path 104 and not limited to be an end point or terminal unit or circuit to the communication path 104. The second communication circuit 336 can include active and passive components, such as microelectronics or an antenna, for interaction with the communication path 104.

The second communication circuit 336 can include a second communication interface 350. The second communication interface 350 can be used for communication between the second communication circuit 336 and other functional units or circuits in the second device 106. The second communication interface 350 can receive information from the other functional units/circuits or can transmit information to the other functional units or circuits.

The second communication interface 350 can include different implementations depending on which functional units or circuits are being interfaced with the second communication circuit 336. The second communication interface 350 can be implemented with technologies and techniques similar to the implementation of the second control interface 344.

The first communication circuit 316 can couple with the communication path 104 to send information to the second device 106 in the first device transmission 308. The second device 106 can receive information in the second communication circuit 336 from the first device transmission 308 of the communication path 104.

The second communication circuit 336 can couple with the communication path 104 to send information to the first device 102 in the second device transmission 310. The first device 102 can receive information in the first communication circuit 316 from the second device transmission 310 of the communication path 104. The mobile compute system 100 can be executed by the first control circuit 312, the second control circuit 334, or a combination thereof.

For illustrative purposes, the second device 106 is shown with the partition containing the second user interface 338, the second storage circuit 346, the second control circuit 334, and the second communication circuit 336, although it is understood that the second device 106 can include a different partition. For example, the second software 342 can be partitioned differently such that some or all of its function can be in the second control circuit 334 and the second communication circuit 336. Also, the second device 106 can include other functional units or circuits not shown in FIG. 3 for clarity.

The functional units or circuits in the first device 102 can work individually and independently of the other functional units or circuits. The first device 102 can work individually and independently from the second device 106 and the communication path 104.

The functional units or circuits in the second device 106 can work individually and independently of the other functional units or circuits. The second device 106 can work individually and independently from the first device 102 and the communication path 104.

The functional units or circuits described above can be implemented in hardware. For example, one or more of the functional units or circuits can be implemented using the a gate, circuitry, a processor, a computer, integrated circuit, integrated circuit cores, a pressure sensor, an inertial sensor, a microelectromechanical system (MEMS), a passive device, a physical non-transitory memory medium containing instructions for performing the software function, a portion therein, or a combination thereof.

For illustrative purposes, the mobile compute system 100 is described by operation of the first device 102 and the second device 106. It is understood that the first device 102 and the second device 106 can operate any of the modules and functions of the mobile compute system 100.

Figure 4:
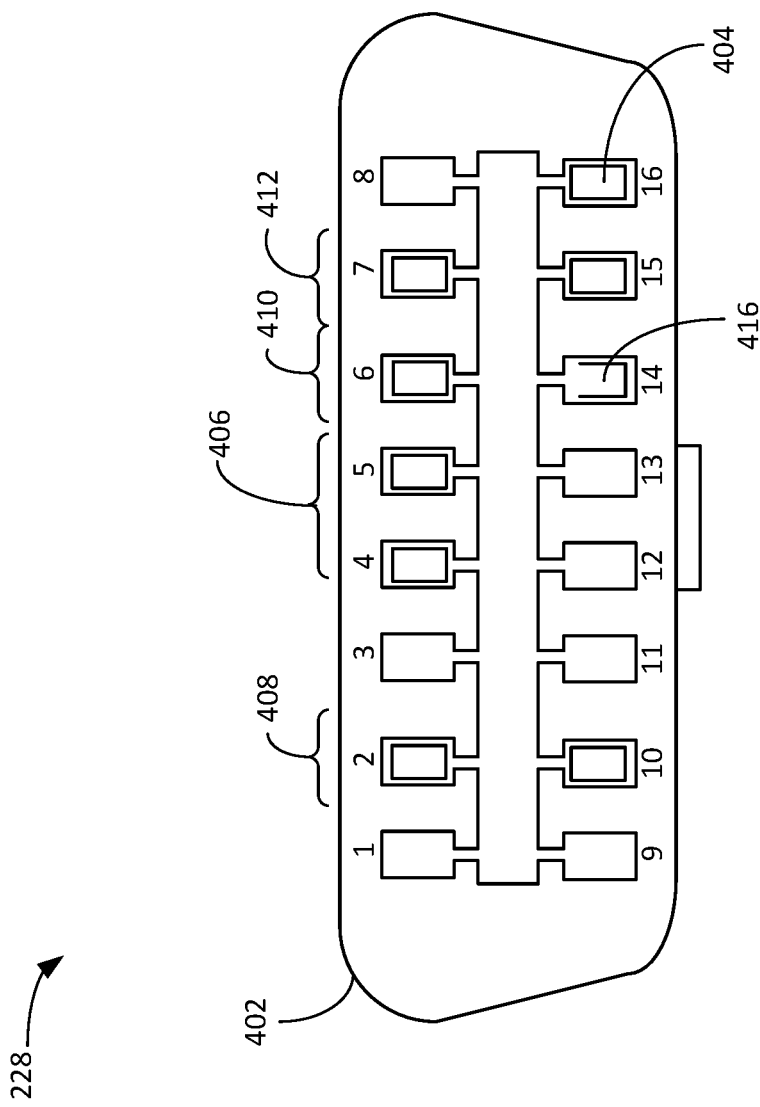
FIG. 4 is an example of a connector drawing for the on-board diagnostics port in an embodiment of the present invention.

Referring now to FIG. 4, therein is shown an example of a connector drawing for the on-board diagnostics port 228 in an embodiment of the present invention. The connector drawing for the on-board diagnostics port 228 depicts a connector body 402 including positions for a connector pin 404. The configuration of the on-board diagnostics port 228 can be defined by the standard for on-board diagnostics (OBD) to support several communication protocols. For ease of discussion the following is based on the OBD-II standard.

As an example, a society of automotive engineering (SAE) J1850 PWM 408 communication standard can utilize a pair of the connector pin 404 located in position 2 and 10. The SAE J1850 PWM 408 receives source voltage from the connector pin 404 located in position 16, and signal ground 406 from the connector pin 404 located in positions 4 and 5. The protocol utilizes pulse width modulation (PWM) to communicate with the on-board diagnostic dongle 232 of FIG. 2.

As a further example, an international organization for standardization (ISO) 15765 CAN 410 communication standard can utilize a pair of the connector pin 404 located in position 6 and 14. The ISO 15765 CAN 410 receives source voltage from the connector pin 404 located in position 16, and signal ground 406 from the connector pin 404 located in positions 4 and 5. The protocol utilizes a two wire serial protocol, operating up to 1 megabit per second, to communicate with the on-board diagnostic dongle 232.

As another example, an ISO 9141-2 serial protocol 412 communication standard can utilize a pair of the connector pin 404 located in position 7 and 15. The ISO 9141-2 serial protocol 412 receives source voltage from the connector pin 404 located in position 16, and signal ground 406 from the connector pin 404 located in positions 4 and 5. The protocol utilizes a two wire serial protocol, operating up to 10.4 kilobit per second, to communicate with the on-board diagnostic dongle 232.

For ease of description, the instance of a loose connector pin 416 is shown in the connector pin 404 located in position 14, as part of the ISO 15765 CAN 410. It is understood that this is an example only and the occurrence of the loose connector pin 416 can be in any of the positions in the connector body 402. The loose connector pin 416 can cause unreliable communication between the controller area network 226 of the vehicle 202 of FIG. 2 and the on-board diagnostic dongle 232. The loose connector pin 416 can be caused by wear, cracking, or bending of the connector pin 404.

The loose connector pin 416 can make intermittent electrical connection between the controller area network 226 and the on-board diagnostic dongle 232. The resulting communication difficulties can result in error messages sent on the controller area network 226 and misinterpreted communication with the on-board diagnostic dongle 232.

Figure 5:
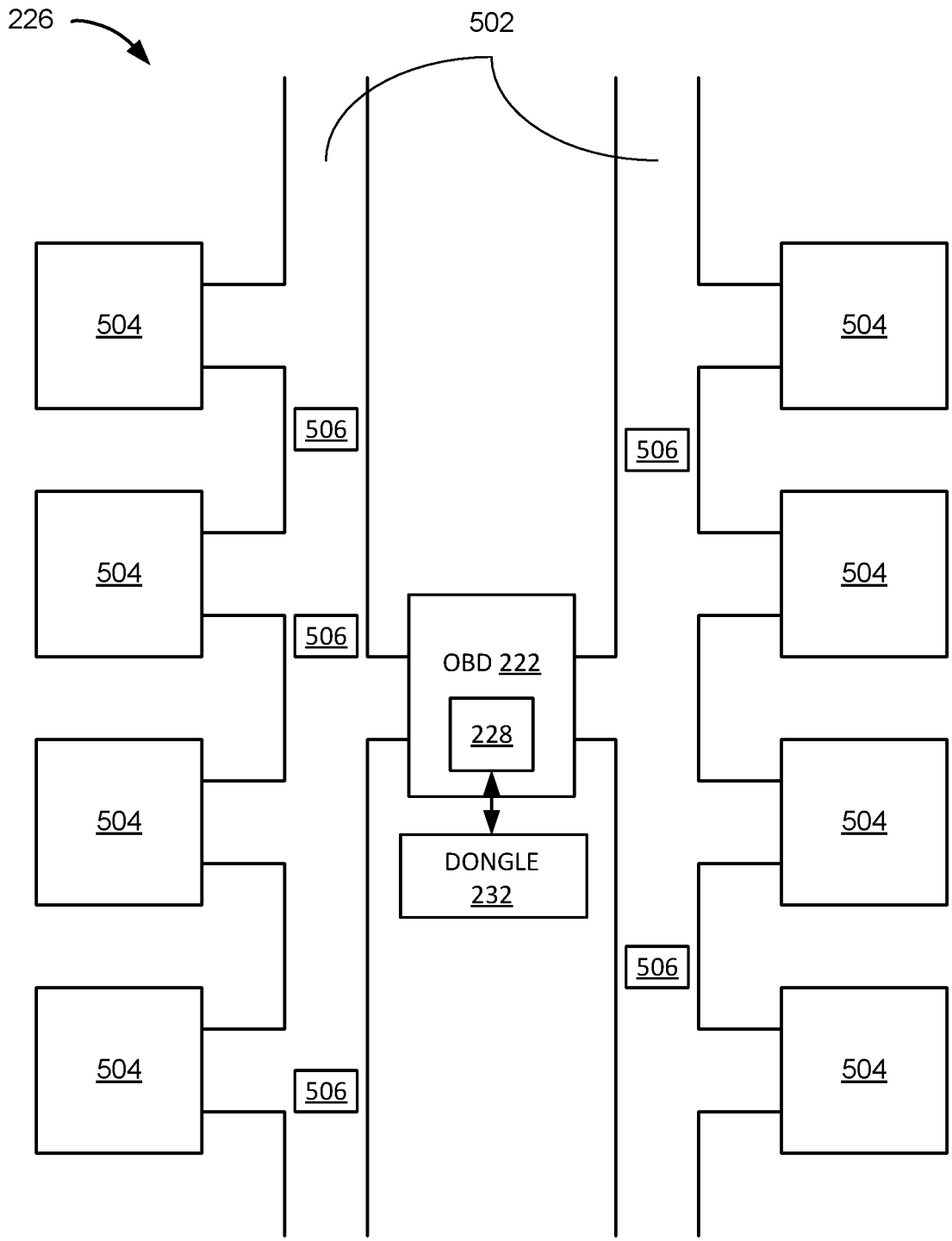
FIG. 5 is an example of a block diagram of a portion of the controller area network within the mobile compute system.

Referring now to FIG. 5, therein is shown an example of a block diagram of a portion of the controller area network 226 of the vehicle 202 in FIG. 2 in the mobile compute system 100 of FIG. 1. The controller area network 226 can include a vehicle bus 502 or multiple instances of the vehicle bus 502. The vehicle bus 502 is the internal communications network that can connect to the vehicle communication circuit 204 of FIG. 2, the vehicle control circuit 206 of FIG. 2, the vehicle storage circuit 208 of FIG. 2, the on-board diagnostics port 228, other interfaces, or a combination thereof. The vehicle bus 502 can operate at a specific baud rate within the controller area network 226. In this embodiment, the multiple instances of the vehicle bus 502 can provide information for the on-board diagnostics 222.

The controller area network 226 can include a node 504 and can connect a number of instances of the node 504. Examples of the node 504 can include the vehicle communication circuit 204, the vehicle control circuit 206, the vehicle storage circuit 208, other hardware circuits, or a combination thereof. As a further example, the node 504 can include an on-board diagnostics dongle connected to the on-board diagnostics port 228, which can be connected to the controller area network 226.

The node 504 can be electrical systems or the subsystems 230 of FIG. 2 in the vehicle 202 that operate some function for the vehicle 202. The vehicle 202 can include numerous instances of the node 504 connected to the vehicle bus 502 of the controller area network 226. For example, the node 504 can operate the function for or relating to the engine, transmission, airbags, antilock braking system, cruise control, power steering, audio systems, doors, battery, or a combination thereof.

The node 504 can interact with the vehicle communication circuit 204, the vehicle control circuit 206, the vehicle storage circuit 208, the on-board diagnostics port 228, further instances of the node 504, other devices, or a combination thereof along the controller area network 226. For example, the node 504 can send and receive a message 506 along the controller area network 226. The on-board diagnostic dongle 232 can interact with the node 504 can send and receive the message 506. The on-board diagnostic dongle 232 can monitor the operations of the node 504 in order to collect information on the operational status of the vehicle 202. The on-board diagnostic dongle 232 can also identify intermittent or the loose connector pin 416 in the on-board diagnostics port 228.

The node 504 can also communicate with an external entity or database. For example, the node 504 can receive data, control commands, or a combination thereof from an external entity or database. As a further example, the node 504 can transmit data, control commands, or a combination thereof to an external entity or database.

For brevity and clarity, the description for the controller area network 226 will be described with the node 504 representing any devices connected to an instance of the vehicle bus 502 of the controller area network 226, as examples described earlier. The instances of the node 504 can be similar, same, or different connected to the controller area network 226 including the subsystems 230.

The message 506 is a packet of data, control commands, or a combination thereof that is transmitted along the vehicle bus 502 of the controller area network 226. For example, the message 506 can provide information about the systems or subsystems in the vehicle 202. As examples, the message 506 can include control commands, status information, error information, queries, or a combination thereof. The on-board diagnostic dongle 232 can monitor the message 506 in order to identify how the vehicle 202 is being driven, where the vehicle 202 is travelling, and the operational status of the vehicle 202.

By way of an example, the loose connector pin 416 of FIG. 4 in the on-board diagnostics port 228 can cause incorrect trip reporting by the on-board diagnostic dongle 232. If the loose connector pin 416 causes a trip record to be interrupted then the trip results will be inaccurate. The on-board diagnostic dongle 232 can detect a disconnect event that can cause the on-board diagnostic dongle 232 to report a disconnect event. Upon the reestablishing of the contact connection, the on-board diagnostic dongle 232 can report a new trip for the vehicle 202. The on-board diagnostic dongle 232 can detect an error when a new trip is detected with a GPS speed of the vehicle 202 is greater than a threshold, such as 10 kilometers per hour.

The message 506 can assist with the operation and function of the controller area network 226. As an example, the message 506 can provide a coordination mechanism from one instance of the node 504 to operate with or control the operation of the controller area network 226, another instance of the node 504, or a combination thereof. In the event, the loose connector pin 416 in the on-board diagnostics port 228 can cause error messages to be generated on the controller area network 226 and in some instances cause diagnostic trouble codes (DTC's) to be logged, set dashboard error lights, force the vehicle 202 into limp mode to protect the drivetrain.

Figure 6:
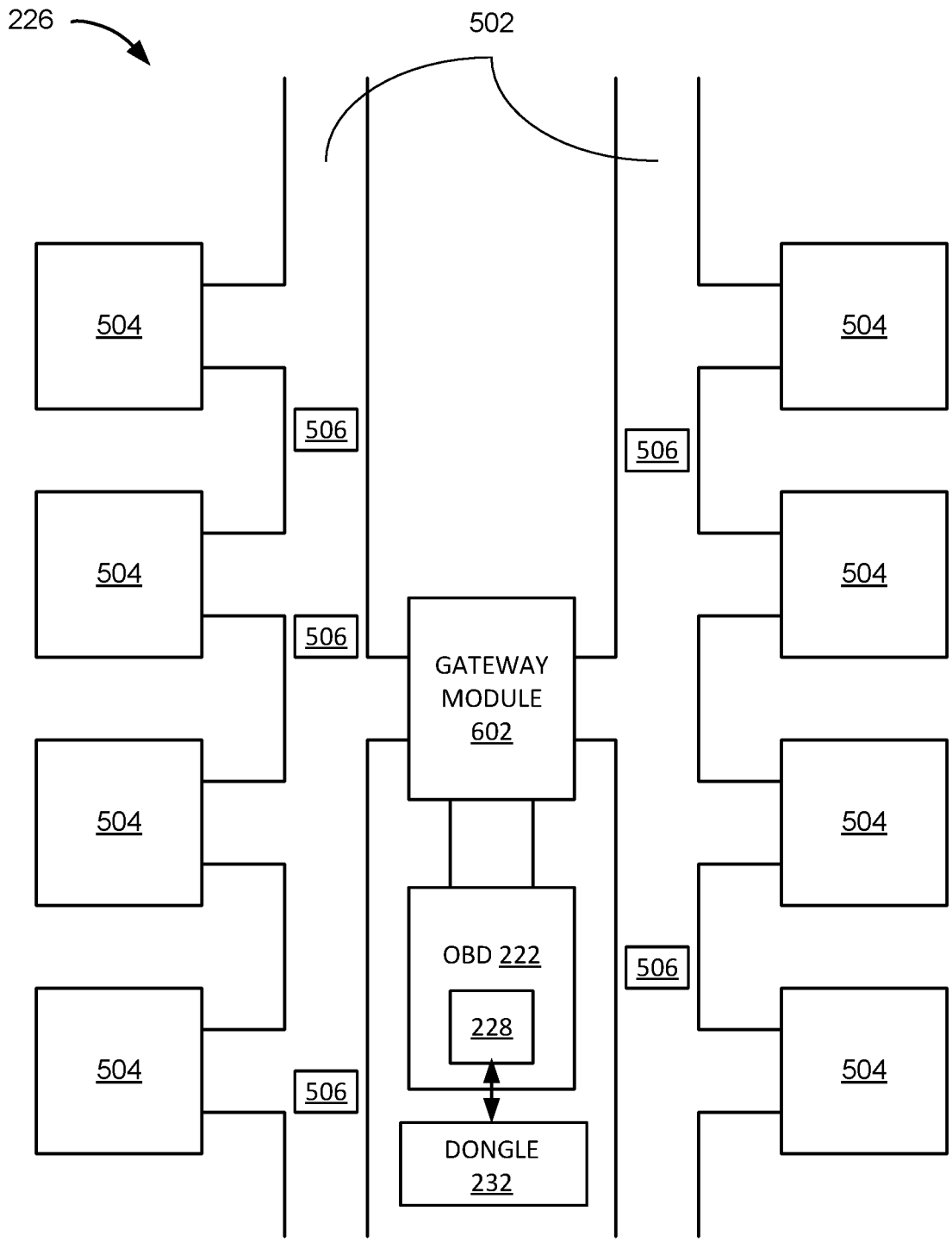
FIG. 6 is an example of a block diagram of a portion of the controller area network with a vehicle architecture within the mobile compute system.

Referring now to FIG. 6, therein is shown an example of another embodiment of a block diagram of a portion of the controller area network 226 of the vehicle 202 in FIG. 2 in the mobile compute system 100 of FIG. 1. In this embodiment, the on-board diagnostics 222 is connected to the controller area network 226 through a gateway module 602. The gateway module 602 is an interface between multiple instances of the vehicle bus 502 operating at different baud rates. The gateway module 602 can include additional functionality. For example, the gateway module 602 can function to include data rate adaption, message filtering, and identifier conversion between multiple instances of the vehicle bus 502. The gateway module 602 can provide additional security and provide authentication of the on-board diagnostic dongle 232 in order to prevent unauthorized access to the vehicle bus 502 and possible disruption of the operation of the vehicle 202. The gateway module 602 can provide verification of the contact reliability between the on-board diagnostics port 228 and the on-board diagnostic dongle 232 during the authentication process.

The gateway module 602 can prevent the on-board diagnostics 222 from receiving the message 506 that is transmitted along the controller area network 226. The gateway module 602 converts the message 506 along the controller area network 226 when communicating with the on-board diagnostics 222, the node 504 connected to the on-board diagnostics port 228, or a combination thereof. For example, the on-board diagnostics 222, the node 504 connected to the on-board diagnostics port 228, or a combination thereof is unable to receive the message 506 through the gateway module 602 prior to authentication of the on-board diagnostic dongle 232. After the authentication process, the on-board diagnostic dongle 232 can communicate with the node 504 to receive the message 506.

In the event the loose connector pin 416 causes a disconnect to be detected, the gateway module 602 would require the on-board diagnostic dongle 232 to be authenticated again before normal communication can commence. The on-board diagnostic dongle 232 can detect the unexpected authentication process from the gateway module 602 and report the suspected loose connector pin 416 in the on-board diagnostics port 228.

Figure 7:
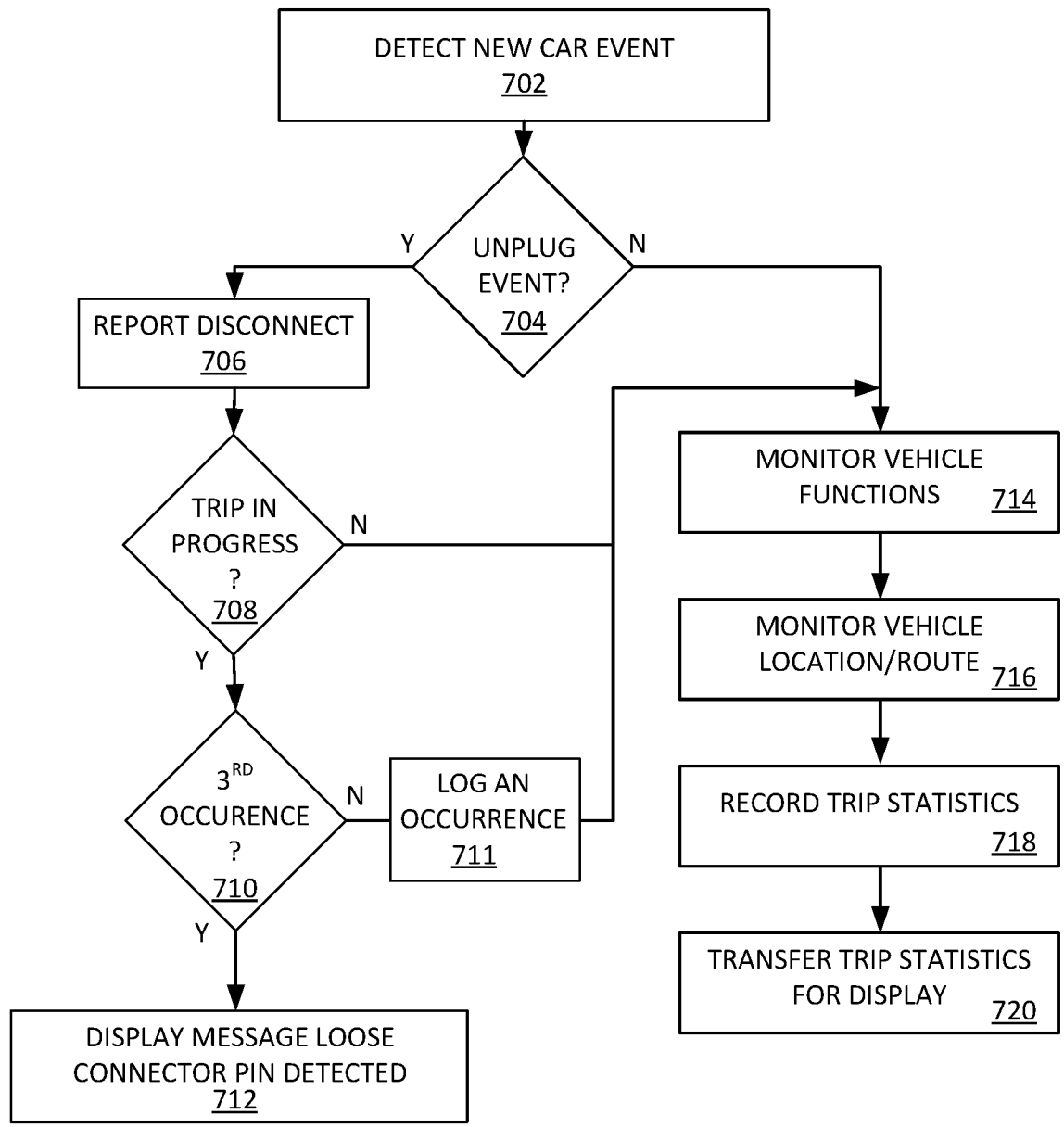
FIG. 7 is an example of a control flow of the mobile compute system.

Referring now to FIG. 7, therein is shown a control flow 701 for the mobile compute system 100. The control flow 701 depicts and describes an example of how to detect the loose connector pin 416 of FIG. 4. The control flow 701 can include a detect new car event module 702, a report disconnect module 706, a display message loose connector pin detected module 712, a monitor vehicle functions module 714, a monitor vehicle location/route module 716, a record trip statistics module 718, a transfer trip statistics for display module 720, or a combination thereof. The aforementioned modules can be included in the first software 326 of FIG. 3, the second software 342 of FIG. 3, or a combination thereof. The first software 326, the second software 342, or a combination thereof can be executed with the first control circuit 312 of FIG. 3, the second control circuit 334 of FIG. 3, the vehicle control circuit 206 of FIG. 2, or a combination thereof.

In the example shown in FIG. 7, the detect new car event module 702 can identify the vehicle 202 of FIG. 2 as ready to initiate movement and a trip can be monitored based on the information provided through the on-board diagnostics 222 of FIG. 2. The control flow 701 can proceed to an unplug event detection 704 The unplug event detection 704 can sample error messages on the controller area network 226 of FIG. 2, an out of sequence order of the message 506 of FIG. 5, an unexpected reauthentication from the gateway module 602 of FIG. 6, a detection by the detect new car event module 702 with a GPS speed greater than 10 kilometers per hour (kph), issuing a diagnostic trouble code (DTC), or a combination thereof. The detection by the unplug event detection 704 can be indicative of the loose connector pin 416 of FIG. 4.

If the unplug event detection 704 does identify a problem, the control flow 701 proceeds to the report disconnect module 706. The report disconnect module 706 can transfer the message 506 from the on-board diagnostic dongle 232 to the first user interface 318 of FIG. 3 to display the message 506 alerting the user (not shown) to the unplug event detection 704.

The control flow 701 proceeds to a trip in progress detection 708 to determine whether the unplug event detection 704 was during a trip in progress. The trip in progress can be any movement of the vehicle 202 between two locations as determined by the first location circuit 320 of FIG. 3. If the unplug event detection 704 was during the trip in progress, the control flow 701 proceeds to a third occurrence check 710 to determine whether the unplug event detection 704 has occurred three times within a time window, such as a seven day period. The time window can be customized by the user or the original equipment manufacturer (OEM) to establish the maximum duration that the unplug event detection 704 remains in effect. After the time window the unplug event detection 704 is negated.

If the third occurrence check 710 does determine that the unplug event detection 704 has occurred three times within the seven day period, the control flow proceeds to a display message loose connector pin detected module 712. The display message loose connector pin detected module 712 can transfer the message 506 from the on-board diagnostic dongle 232 to the first user interface 318 of FIG. 3 to display the message 506 alerting the user (not shown) to the loose connector pin 416.

In the event that the detect new car event module 702 is initiated and the unplug event detection 704 does not detect any issues, the control flow proceeds to the monitor vehicle functions module 714, in which the on-board diagnostic dongle 232 can receive the message 506 detailing the status and operations of the subsystems 230 of FIG. 2 as the vehicle 202 is in operation. The monitor vehicle functions module 714 can selectively record portions of the message 506 in order to log how the vehicle 202 is controlled during its operation.

The control flow 701 then proceeds to the monitor vehicle location/route module 716, in which the on-board diagnostic dongle 232 can receive the message 506 from the first location circuit 320 detailing the current position, direction, and velocity of the vehicle 202. It is understood that the first control circuit 312 of FIG. 3 and the first communication circuit 316 of FIG. 3 are utilized to generate the message 506 sent to the on-board diagnostic dongle 232. The on-board diagnostic dongle 232 can selectively store information about the route travelled by the vehicle 202.

The control flow 701 proceeds to the record trip statistics module 718 to compile pertinent information about the movement of the vehicle 202. By way of an example, the on-board diagnostic dongle 232 can be configured to monitor where the vehicle 202 goes and how it is controlled. This can be pertinent to an insurance monitoring version of the on-board diagnostic dongle 232 or a parent monitoring a teenage driver through the on-board diagnostic dongle 232.

It is understood that the goal of the record trip statistics module 718 can be configured for other purposes, including monitoring mileage of the vehicle 202 used in business, to manage the maintenance schedule of the vehicle 202, to document how the vehicle 202 is controlled during a trip, to monitor whether the vehicle 202 deviates from a planned route during the trip, or a combination thereof. Since the subsystems 230 communicating through the controller area network 226 can provide extremely detailed information about the status and operation of the subsystems 230 and the vehicle 202 in general, the on-board diagnostic dongle 232 can be configured to selectively record specific portions of the message 506 that apply to the goal of the user.

The control flow 701 then proceeds to the transfer trip statistics for display module 720, in which the on-board diagnostic dongle 232 having detected that the trip is complete, can compose the message 506 for transfer to the to the first user interface 318 to display the message 506 alerting the user of the trip statistics pertinent to the user. It is understood that the first control circuit 312 and the first communication circuit 316 are utilized to receive the message 506 sent by the on-board diagnostic dongle 232. The transfer trip statistics for display module 720 can include a status of the unplug event 704 detected during the trip. The status of the unplug event 704 can provide a history to aid in analysis of an intermittent one of the loose connector pin 416.

In the control flow 701, if the unplug event detection 704 occurs but a trip in progress detection 708 is negative, meaning the vehicle 202 is not travelling at the time the unplug event detection 704 occurs, the control flow 701 proceeds to the monitor vehicle function module 714. Also, if the unplug event detection 704 occurs and the trip in progress detection 708 is true, the control flow 701 proceeds to the third occurrence check 710. If the third occurrence check 710 is negative, meaning less than three occurrences of the unplug event detection 704 have occurred, the control flow 701 proceeds to a log an occurrence module 711. The log an occurrence module 711 can record the first occurrence or the subsequent occurrence of the unplug event detection 704. The control flow then proceeds to the monitor vehicle function module 714 to oversee the operational status of the vehicle 202.

When the display message loose connector pin detected module 712 has been asserted, the on-board diagnostic dongle 232 can send the message 506 for the user to examine or replace the on-board diagnostic port 228 and acknowledge the action to the on-board diagnostic dongle 232. If the detection of the loose connector pin 416 persists after the user has acknowledged the change of the on-board diagnostic port 228 the on-board diagnostic dongle 232 can declare itself incompatible. The user could attempt to insert an extension cable between the on-board diagnostic port 228 and the on-board diagnostic dongle 232.

It has been discovered that the mobile compute system 100 improves the reliability for calculating the diagnostic information for the vehicle 202 by alerting the user to the detection of the loose connector pin 416. For example, the mobile compute system 100 can implement the detection of the loose connector pin 416 based on a different number of the occurrences of the unplug event detection 704. By detecting the loose connector pin 416 and alerting the user to repair the connector body 402, a more reliable and efficient record of the operation of the vehicle 202 can be achieved. The detection of the loose connector pin 416 can improve the operation of the controller area network 226 and improve the operation and safety of the vehicle 202.

The modules described in this application can be hardware implementation or hardware accelerators, including passive circuitry, active circuitry, or both, in the first storage circuit 314, the second storage circuit 346, the first control circuit 312, the second control circuit 334, or a combination thereof. The module can also be hardware implementation or hardware accelerators, including passive circuitry, active circuitry, or both, within the first device 102, the second device 106, or a combination thereof but outside of the first storage circuit 314, the second storage circuit 346, the first control circuit 312, the second control circuit 334, or a combination thereof.

For illustrative purposes, the various modules have been described as being specific to the first device 102, the second device 106, or the vehicle 202. However, it is understood that the modules can be distributed differently. For example, the various modules can be implemented in a different device, or the functionalities of the modules can be distributed across multiple devices. Also as an example, the various modules can be stored in a non-transitory memory medium.

As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit or circuit, such as a chip or a processor, or across multiple hardware units or circuits.

The modules described in this application can be stored in the non-transitory computer readable medium. The first storage circuit 314, the second storage circuit 346, or a combination thereof can represent the non-transitory computer readable medium. The first storage circuit 314, the second storage circuit 346, the vehicle storage circuit 208, or a combination thereof, or a portion therein can be removable from the first device 102, the second device 106, the vehicle 202, or a combination thereof. Examples of the non-transitory computer readable medium can be a non-volatile memory card or stick, an external hard disk drive, a tape cassette, or an optical disk.

Figure 8:
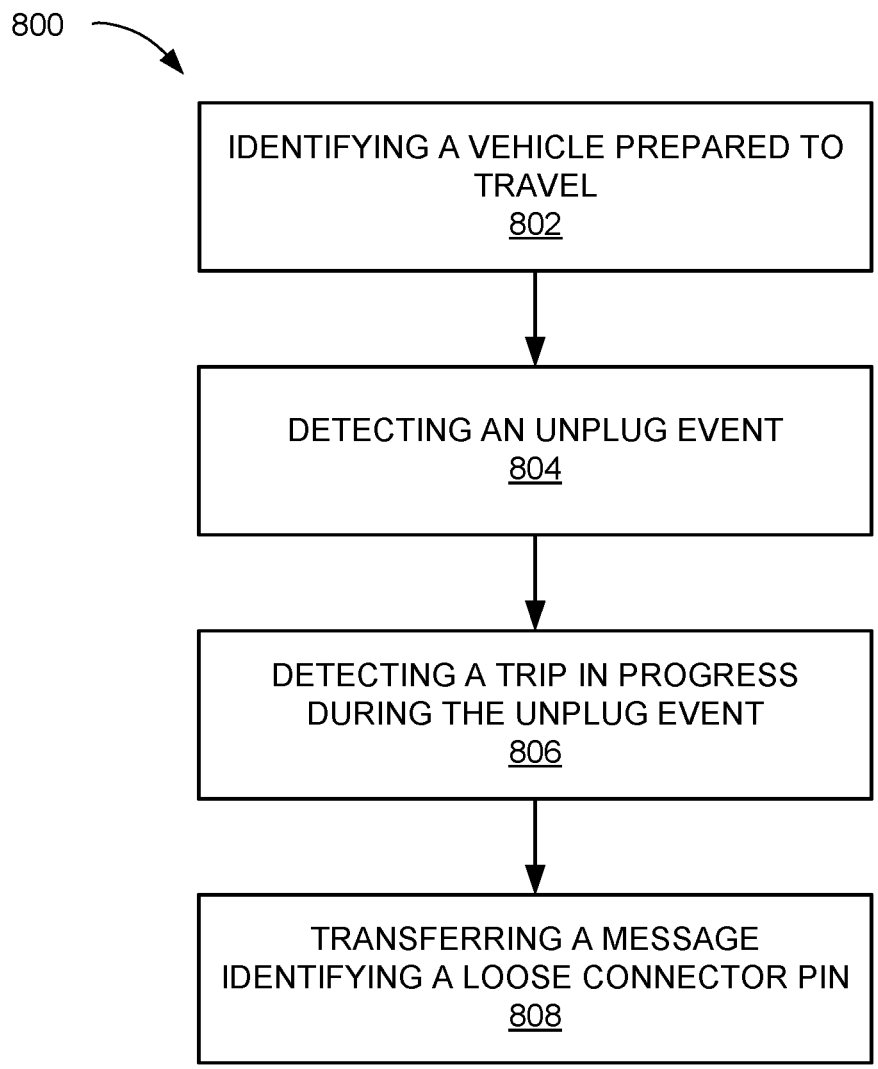
FIG. 8 is a flow chart of a method of operation of a mobile compute system in an embodiment of the present invention.

Referring now to FIG. 8, therein is shown a flow chart of a method 800 of operation of a mobile compute system 100 in an embodiment of the present invention. The method 700 includes: identifying a vehicle prepared to travel by monitoring an on-board diagnostics in a block 802; detecting an unplug event based on a message from the on-board diagnostics in a block 804; detecting a trip in progress during the unplug event in a block 806; and transferring the message identifying a loose connector pin in an on-board diagnostic port during the trip in progress for displaying on a device in a block 808.

As an example, the method 700 further includes wherein identifying the vehicle make-model-year includes determining a vehicle make; and determining a vehicle model, a model year, or a combination thereof based on a message sequence of the message group. Further as an example, the method 700 includes receiving an identification correct for the vehicle identification; and supplementing the message group as the footprint with the identification correction to improve an accuracy of the match.

Also as an example, the method 700 includes wherein identifying the vehicle make-model-year include determining a vehicle model, a model year, or a combination thereof based on: a message sequence of the message group; and a message rate within the message group. Also as an example, the method 700 includes triggering a vehicle function based on the vehicle make-model-year identified by the match.

Yet further as an example, the method 700 includes determining a vehicle architecture based on not receiving a message group from the on-board diagnostics; and linking the vehicle architecture as the footprint to the vehicle make-model-year.

Still further as an example, the method 700 includes receiving an identification correction for the vehicle identification; and supplementing the message group as the footprint with the identification correction to improve an accuracy of the match including improving an artificial intelligence model to identify the vehicle make-model-year, the vehicle identification, or a combination thereof based on the identification correction.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method of operation for a mobile compute system comprising:
    identifying a vehicle prepared to travel by monitoring an on-board diagnostics;
    detecting an unplug event based on an error message from a communication protocol of the on-board diagnostics;
    detecting a trip in progress during the unplug event; and
    transferring a message group identifying a loose connector pin in an on-board diagnostic port during the trip in progress for displaying on a device.

2. The method as claimed in claim 1 wherein identifying the vehicle prepared to travel includes:
    receiving the message group from an engine control unit node;
    receiving the message group from a braking system node;
    receiving the message group from a transmission system node and
    determining an engine is on, a brake is engaged, and a transmission is engaged.

3. The method as claimed in claim 1 wherein detecting the unplug event includes receiving the message group out of sequence, performing a reauthentication with a gateway module, detecting a new car event with a speed greater than a threshold, issuing a diagnostic trouble code (DTC), or a combination thereof.

4. The method as claimed in claim 1 further comprising detecting the loose connector pin during authenticating with a gateway module.

5. The method as claimed in claim 1 wherein displaying the message group identifying a loose connector pin includes detecting the unplug event three times in a time window.

6. The method as claimed in claim 1 further comprising:
    monitoring functions of the vehicle after a first occurrence of the unplug event includes receiving the message group from subsystems of the vehicle; and
    monitoring vehicle location/route after the first occurrence of the unplug event includes receiving the message group from a control unit with location information from a location circuit.

7. The method as claimed in claim 1 further comprising transferring trip statistics for display includes:
    reporting a disconnect based on the unplug event detection; and
    logging the occurrence of the unplug event in a trip statistics displayed in the vehicle.

8. A mobile compute system comprising:
    a communication circuit configured to:
        transmit a message, identifying a vehicle prepared to travel, through an on-board diagnostic, and
        receive the message from the on-board diagnostic identifying a loose connector pin in an on-board diagnostic port;
    a control circuit, coupled to the communication circuit, configured to:
        determine an unplug event has occurred based on an error message from a communication protocol of the on-board diagnostic,
        detect a trip in progress during the unplug event, and
        transfer a message group, to identify the loose connector pin in the on-board diagnostic port, for displaying on a device.

9. The system as claimed in claim 8 wherein the control circuit is further configured to:
    receive the message group from an engine control unit node;
    receive the message group from a braking system node; and
    receive the message group from a transmission system node; and
    determine an engine is on, a brake is engaged, and a transmission is engaged.

10. The system as claimed in claim 8 wherein the control circuit is further configured to detect the unplug event includes receive the message group out of sequence, perform a reauthentication with a gateway module, detect a new car event with a speed greater than a threshold, issue a diagnostic trouble code (DTC), or a combination thereof.

11. The system as claimed in claim 8 wherein the control circuit is further configured to detecting the loose connector pin during authentication with a gateway module.

12. The system as claimed in claim 8 wherein the control circuit is further configured to display the message group to identify a loose connector pin includes detecting the unplug event three times in a time window.

13. The system as claimed in claim 8 wherein the control circuit is further configured to:
    monitor functions of the vehicle after a first occurrence of the unplug event includes receiving the message group from subsystems of the vehicle; and monitor vehicle location/route after the first occurrence of the unplug event includes receiving the message group from a control unit with location information from a location circuit.

14. The system as claimed in claim 8 wherein the control circuit is further configured to transfer trip statistics for display includes:
   reporting a disconnect based on the unplug event detection; and
   logging the occurrence of the unplug event in a trip statistics displayed in the vehicle.

15. A non-transitory computer readable medium including instructions executable by a control circuit for a mobile compute system comprising:
   identifying a vehicle prepared to travel by monitoring an on-board diagnostics;
   detecting an unplug event based on an error message from a communication protocol of the on-board diagnostics;
   detecting a trip in progress during the unplug event; and
   transferring a message group identifying a loose connector pin in an on-board diagnostic port during the trip in progress for displaying on a device.

16. The non-transitory computer readable medium as claimed in claim 15 wherein identifying the vehicle prepared to travel includes:
   receiving the message group from an engine control unit node;
   receiving the message group from a braking system node;
   receiving the message group from a transmission system node and
   determining an engine is on, a brake is engaged, and a transmission is engaged.

17. The non-transitory computer readable medium as claimed in claim 15 wherein detecting the unplug event includes receiving the message group out of sequence, performing a reauthentication with a gateway module, detecting a new car event with a speed greater than a threshold, issuing a diagnostic trouble code (DTC), or a combination thereof.

18. The non-transitory computer readable medium as claimed in claim 15 further comprising detecting the loose connector pin during authenticating with a gateway module.

19. The non-transitory computer readable medium as claimed in claim 15 wherein displaying the message group identifying a loose connector pin includes detecting the unplug event three times in a time window.

20. The non-transitory computer readable medium as claimed in claim 15 further comprising:
   monitoring functions of the vehicle after a first occurrence of the unplug event includes receiving the message group from subsystems of the vehicle; and
   monitoring vehicle location/route after the first occurrence of the unplug event includes receiving the message group from a control unit with location information from a location circuit.

\* \* \* \* \*